(12) United States Patent
Lee

(10) Patent No.: US 7,374,967 B2
(45) Date of Patent: May 20, 2008

(54) MULTI-STACK CHIP SIZE PACKAGING METHOD

(75) Inventor: Naewon Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/747,108

(22) Filed: Dec. 30, 2003

(65) Prior Publication Data

US 2004/0150098 A1    Aug. 5, 2004

(30) Foreign Application Priority Data

Dec. 30, 2002    (KR) .................. 10-2002-0086406

(51) Int. Cl.
  *H01L 21/00*    (2006.01)
(52) U.S. Cl. ............... 438/109; 257/E21.499; 257/E21.506; 257/E21.507
(58) Field of Classification Search ................ 438/109, 438/122, 124, 126, 127
See application file for complete search history.

(56) References Cited

U.S. PATENT DOCUMENTS

| 5,952,725 | A | * | 9/1999 | Ball ............................. 257/777 |
| 6,080,264 | A | * | 6/2000 | Ball ............................. 156/292 |
| 6,104,093 | A | * | 8/2000 | Caletka et al. .............. 257/778 |
| 6,316,838 | B1 | * | 11/2001 | Ozawa et al. ................ 257/778 |
| 6,414,384 | B1 | * | 7/2002 | Lo et al. ...................... 257/685 |
| 6,633,078 | B2 | * | 10/2003 | Hamaguchi et al. ........ 257/686 |
| 6,867,500 | B2 | * | 3/2005 | Corisis et al. ............... 257/777 |

\* cited by examiner

*Primary Examiner*—David A Zarneke
(74) *Attorney, Agent, or Firm*—Pillsbury Winthrop Shaw Pittman LLP

(57) ABSTRACT

In multi-stack chip size packaging a plurality chips, a first chip is electrically interconnected on a top surface of a substrate using a bump. Next, an epoxy is coated on the first chip and is stacked a second chip thereon, wherein the second chip is electrically interconnected to the substrate through an inner lead bonding. A potting solution is coated on the substrate and the second chip and installed thereon a heat spreader and then cured. An encapsulation resin is coated on a bottom surface of the substrate and electrically interconnected a third chip to the bottom surface of the substrate through a bump and an inner lead bump.

4 Claims, 2 Drawing Sheets

BONDING PAD

BALL PAD

BONDING PAD

MULTI-STACK CHIP SIZE PACKAGING METHOD

CROSS REFERENCE TO RELATED APPLICATIONS

This application claims priority to Korean application No. 10-2002-0086406, filed Dec. 30, 2002, the contents of which is incorporated herein in its entirety by reference.

FIELD OF THE INVENTION

The present invention relates to a method of multi-a stack chip size package; and, more particularly, to a method for multi-stack chip size packaging a plurality of chips at both a top and a bottom surface of a substrate to thereby reduce a thickness of the multi-stack chip size package and to enhance a packaging efficiency.

BACKGROUND OF THE INVENTION

FIG. 1 illustrates a cross sectional view of a conventional multi-stack chip size package (CSP).

Referring to FIG. 1, a first chip (or die) 20 is adhered on a substrate 10, e.g., a printed circuit board, with an epoxy and a second chip (or die) 30 is stacked thereon with the epoxy. Bonding pads on the first and the second chip 20 and 30 are electrically connected with terminals on the printed circuit board 10 by conductive wires 50. A resin, e.g., an epoxy molding compound (EMC) 40 is used to mold the first and the second chip 20 and 30, and the electrical connection between the whole package and an another printed circuit board can be achieved by ball grid array using solder balls 60.

The drawback of the conventional multi-stack chip size packaged device is that a thickness thereof is to be enlarged, e.g., about 1.4 mm, because of the molding material of the multi-stack CSP, i.e., the resin, to thereby require a long conductive wire 50, i.e., a long signal transmission path. Therefore, the characteristics of the multi-stack chip size packaged device are deteriorated and the applicability thereof is also reduced. In addition, heat dissipation thereof is not effective.

SUMMARY OF THE INVENTION

It is, therefore, an object of the present invention to provide a method for by multi-stack chip size packaging a plurality of chips at both a top and a bottom surface of a substrate to reduce the thickness of the multi-stack chip size package to enhance a packaging efficiency.

In accordance with the present invention, there is provided a method for multi-stack chip size packaging a plurality chips, which including the steps of: electrically interconnecting a first chip into a top surface of a substrate using a bump; stacking a second chip on the first chip, wherein the second chip is electrically interconnected to the substrate through an inner lead bonding; coating an insulating potting solution on the substrate and the second chip and installing thereon a heat spreader and then curing the potting solution; and coating an encapsulation resin on a bottom surface of the substrate and electrically interconnecting a third chip to the bottom surface of the substrate through a bump and a inner lead bump.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

A preferred embodiment in accordance with the present invention will now be described with reference to the accompanying drawings.

Figure 1:
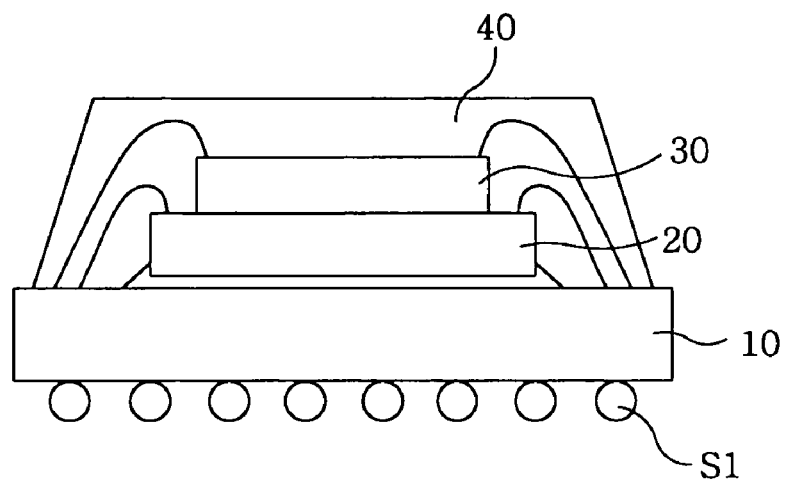
FIG. 1 represents a cross sectional view of a conventional multi-stack chip size package (CSP)
Figure 2:
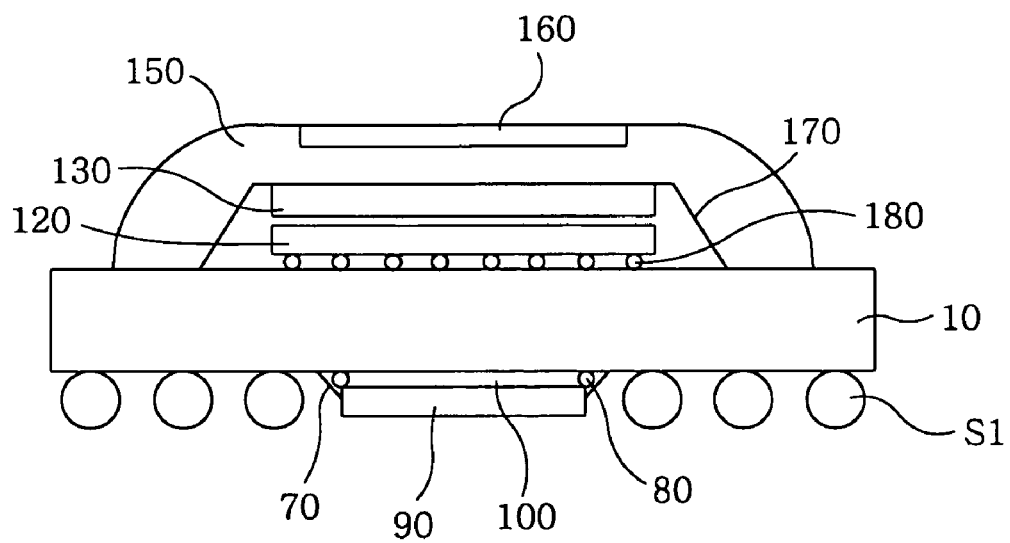
FIG. 2 illustrates a cross sectional view of a multi-stack CSP in accordance with a preferred embodiment of the present invention.
Figure 3A:
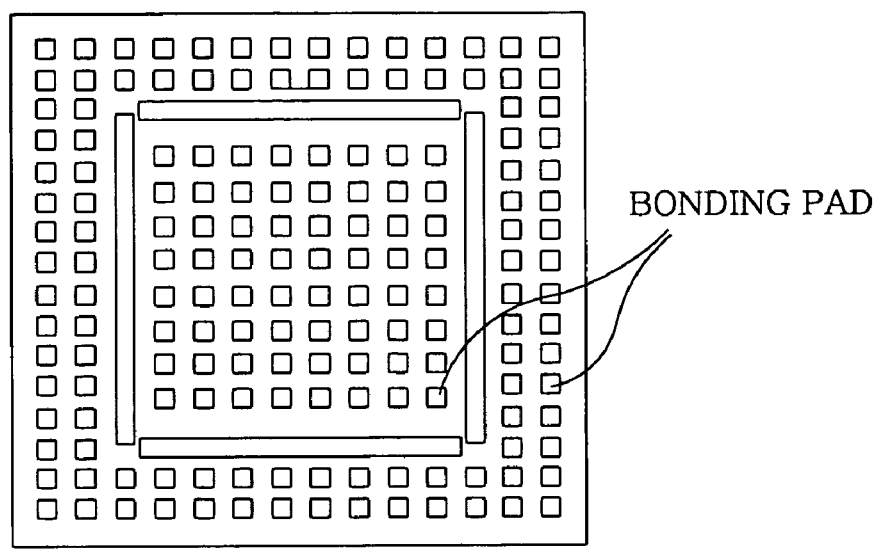
FIG. 3A depicts a top view of the multi-stack CSP in accordance with the preferred embodiment of the present invention.
Figure 3B:
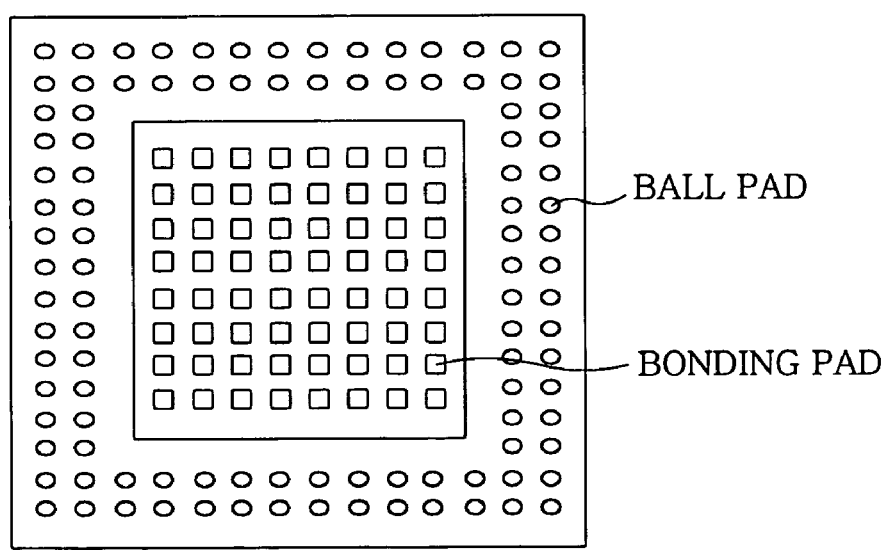
FIG. 3B illustrates a bottom view of the multi-stack CSP in accordance with the preferred embodiment of the present invention.

FIG. 2 illustrates a cross sectional view of a multi-stack chip size packaged (CSP) device in accordance with a preferred embodiment of the present invention. FIGS. 3A and 3B depict a top and a bottom view of the multi-stack chip sized packaged device in accordance with the preferred embodiment of the present invention.

Referring to FIGS. 2 to 3B, a first chip 120, e.g., a flip chip, is electrically interconnected to a top surface of a rigid or flexible substrate 10, e.g., a printed circuit board (PCB), through a bump 180 therebetween. Next, an epoxy is coated on the first chip 120 and a second chip 130 is stacked thereon. The second chip 130 is electrically interconnected to the PCB through an inner lead boding (ILB) scheme 170. And then, an insulating potting solution is coated on the second chip 130 and cured. A heat spreader 160 is mounted thereon for dissipating heat generated in the chips 120 and 130.

Next, a third chip 190, e.g., another flip chip, is electrically interconnected to a bottom surface of the PCB 10 using a bump 80 therebetween and an ILB 70 and then encapsulated by an encapsulation resin 100. Finally, a ball grid array S1 using solder balls is mounted on the bottom surface of the PCB 10.

Therefore, the multi-chip chip size packaged device in accordance with the preferred embodiment of the present invention use the top and the bottom surface of the PCB to thereby enhance a packaging efficiency. Also, by reducing the thickness of the device, e.g., less than 1.0 mm, that is to say, an electrical distance between the chips and the PCB, operational characteristics of the device can be enhanced.

While the invention has been shown and described with respect to the preferred embodiments, it will be understood by those skilled in the art that various changes and modifications may be made without departing from the spirit and scope of the invention as defined in the following claims.

What is claimed is:

1. A method for multi-stack chip size packaging a plurality of chips, comprising:
    directly electrically interconnecting a first chip onto a top surface of a substrate through a bump;
    stacking a second chip on the first chip, wherein the second chip is electrically interconnected to the substrate through an inner lead bonding;

coating a potting solution on the substrate and the second chip and installing thereon a heat spreader and then curing the potting solution; and coating an encapsulation resin on a bottom surface of the substrate and directly electrically interconnecting a third chip onto the bottom surface of the substrate through a bump and an inner lead bonding.

2. The method of claim 1, wherein the substrate is a rigid or a flexible substrate.

3. The method of claim 1, wherein the heat spreader facilitates a heat dissipation of the multi-stack chip size stack package.

4. The method of claim 1, wherein the potting solution is an insulating solution for protecting the multi-stack chip size stack package from an external environment.

* * * * *